(12) United States Patent
Park et al.

(10) Patent No.: US 10,438,799 B2
(45) Date of Patent: Oct. 8, 2019

(54) METHODS OF FABRICATING SEMICONDUCTOR DEVICES INCLUDING SUPPORT PATTERNS

(71) Applicant: Samsung Electronics Co., Ltd., Suwon-si, Gyeonggi-do (KR)

(72) Inventors: Sang Jine Park, Suwon-si (KR); Yong Sun Ko, Suwon-si (KR); In Seak Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 207 days.

(21) Appl. No.: 15/473,333

(22) Filed: Mar. 29, 2017

(65) Prior Publication Data
US 2018/0040483 A1 Feb. 8, 2018

(30) Foreign Application Priority Data
Aug. 8, 2016 (KR) ........................ 10-2016-0100738

(51) Int. Cl.
| | |
|---|---|
| *H01L 21/033* | (2006.01) |
| *H01L 21/28* | (2006.01) |
| *H01L 29/423* | (2006.01) |
| *H01L 29/66* | (2006.01) |
| *H01L 29/78* | (2006.01) |
| *H01L 21/3213* | (2006.01) |

(Continued)

(52) U.S. Cl.
CPC .... *H01L 21/28114* (2013.01); *H01L 21/0337* (2013.01); *H01L 21/28123* (2013.01); *H01L 21/28132* (2013.01); *H01L 21/32139* (2013.01); *H01L 21/823431* (2013.01); *H01L 29/4238* (2013.01); *H01L 29/42376* (2013.01); *H01L 29/66795* (2013.01); *H01L 29/7856* (2013.01); *H01L 27/0207* (2013.01)

(58) Field of Classification Search
CPC combination set(s) only.
See application file for complete search history.

(56) References Cited

U.S. PATENT DOCUMENTS

| | | |
|---|---|---|
| 8,053,346 B2 | 11/2011 | Ryu et al. |
| 8,392,856 B2 | 3/2013 | Misaka et al. |
| 9,105,467 B2 | 8/2015 | Lee et al. |

(Continued)

FOREIGN PATENT DOCUMENTS

| | | |
|---|---|---|
| KR | 100842918 B1 | 7/2008 |
| KR | 1020150034506 A | 4/2015 |

*Primary Examiner* — Mohammad M Choudhry
(74) *Attorney, Agent, or Firm* — Myers Bigel, P.A.

(57) ABSTRACT

A method of fabricating semiconductor devices includes sequentially forming a gate layer and a mandrel layer on a substrate, forming a first photoresist on the mandrel layer, forming a mandrel pattern by at least partially removing the mandrel layer using the first photoresist as a mask, forming a spacer pattern that comprises a first mandrel spacer located on a side of a first mandrel included in the mandrel pattern and a second mandrel spacer located on the other side of the first mandrel, forming a sacrificial layer that covers the first and second mandrel spacers after removing the mandrel pattern, forming a second photoresist including a bridge pattern overlapping parts of the first and second mandrel spacers on the sacrificial layer; and forming a gate pattern by at least partially removing the gate layer using the first and second mandrel spacers and the second photoresist as a mask.

14 Claims, 27 Drawing Sheets

(51) Int. Cl.
*H01L 21/8234* (2006.01)
*H01L 27/02* (2006.01)

(56) References Cited

U.S. PATENT DOCUMENTS

| | | |
|---|---|---|
| 9,306,037 B2 | 4/2016 | Lin et al. |
| 2012/0007187 A1 | 1/2012 | Ryu et al. |
| 2012/0231594 A1* | 9/2012 | Wang ............... H01L 21/28273 438/266 |
| 2015/0287733 A1 | 10/2015 | Matsudaira et al. |

* cited by examiner

METHODS OF FABRICATING SEMICONDUCTOR DEVICES INCLUDING SUPPORT PATTERNS

This U.S. non-provisional patent application claims priority under 35 U.S.C. § 119 to Korean Patent Application No. 10-2016-0100738, filed on Aug. 8, 2016, in the Korean Intellectual Property Office, the entire contents of which are incorporated by reference herein.

BACKGROUND

1. Field

The present inventive concepts relate to methods of fabricating semiconductor devices.

2. Description of the Related Art

A highly scaled and highly integrated semiconductor device can be implemented by forming patterns which have a fine width and are separated from each other by a fine pitch. The fine patterns of the semiconductor device can be formed using, e.g., double-patterning technology (DPT) and quad-patterning technology (QPT) that applies double patterning twice. A technology which can simultaneously form various fine patterns may be used to implement semiconductor devices having various patterns.

SUMMARY

Aspects of the inventive concepts provide a method of fabricating semiconductor devices including a support part which restricts the possible leaning of a dummy gate pattern formed with a fine pitch.

According to aspects of the inventive concepts, there is provided a method of fabricating a semiconductor device, the method including sequentially forming a gate layer and a mandrel layer on a substrate, forming a first photoresist on the mandrel layer, forming a mandrel pattern that extends in a first direction by at least partially removing the mandrel layer using the first photoresist as a first mask, forming a spacer pattern that comprises a first mandrel spacer located on a side of a first mandrel included in the mandrel pattern and a second mandrel spacer located on the other side of the first mandrel, forming a sacrificial layer on the first and second mandrel spacers after removing the mandrel pattern, forming a second photoresist, that comprises a bridge pattern overlapping part of the first mandrel spacer and part of the second mandrel spacer and extending in a second direction intersecting the first direction, on the sacrificial layer; and forming a gate pattern by at least partially removing the gate layer using the first and second mandrel spacers and the second photoresist as a second mask.

According to other aspects of the inventive concepts, there is provided a method of fabricating a semiconductor device, the method including sequentially forming a gate layer and a mandrel layer on a substrate, forming a first photoresist on the mandrel layer, forming a mandrel pattern that extends in a first direction by at least partially removing the mandrel layer using the first photoresist as a first mask, forming a first mandrel spacer on a side of a first mandrel included in the mandrel pattern and a second mandrel spacer on the other side of the first mandrel, forming a sacrificial layer on the first and second mandrel spacers after removing the mandrel pattern, forming a second photoresist, that comprises a first support pattern overlapping part of the first mandrel spacer and not overlapping the second mandrel spacer, on the sacrificial layer, and forming a gate pattern by at least partially removing the gate layer using the first and second mandrel spacers and the second photoresist as a second mask.

According to other aspects of the inventive concepts, there is provided a method of fabricating a semiconductor device, the method including forming a gate layer on a substrate, forming a spacer pattern on the gate layer, the spacer pattern including a plurality of individual spacers extending in a first direction, forming a sacrificial layer on the spacer pattern, forming a photoresist on at least one of the individual spacers of the spacer pattern and the sacrificial layer, the photoresist having a first width, in a second direction intersecting the first direction, that is greater than a second width in the second direction of the at least one of the individual spacers, forming a gate pattern by at least partially removing the gate layer using the spacer pattern and the photoresist as a mask.

However, aspects of the inventive concepts are not restricted to the ones set forth herein. The above and other aspects of the inventive concepts will become more apparent to one of ordinary skill in the art to which the inventive concepts pertain by referencing the detailed description of the inventive concepts given below.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, semiconductor devices and methods of fabricating semiconductor devices according to embodiments will be described with reference to FIGS. 1 through 24.

Figure 1:
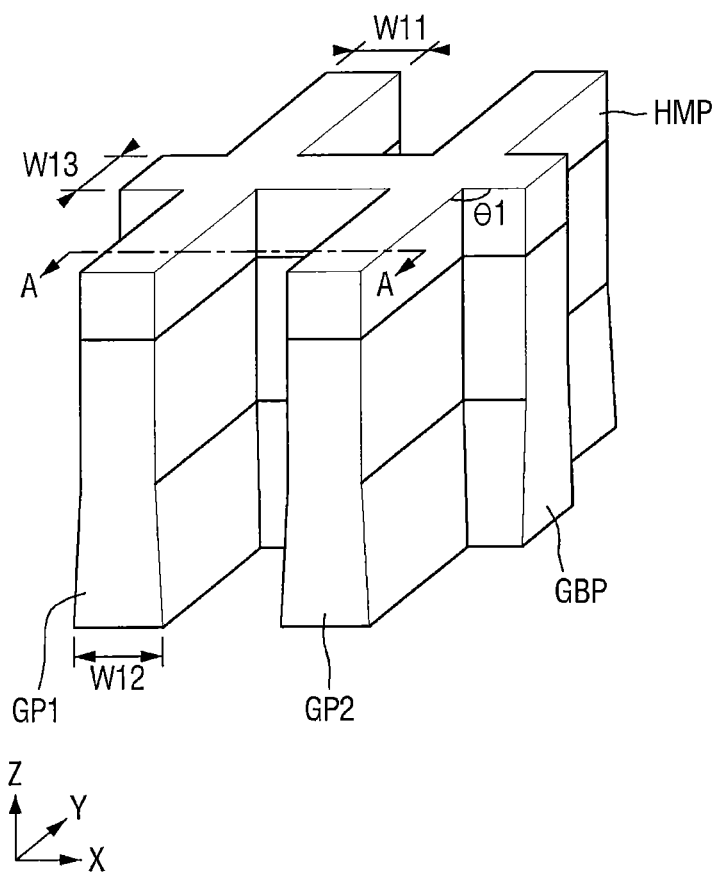
FIG. 1 is a perspective view of a semiconductor device according to embodiments of the inventive concepts.
Figure 2A:
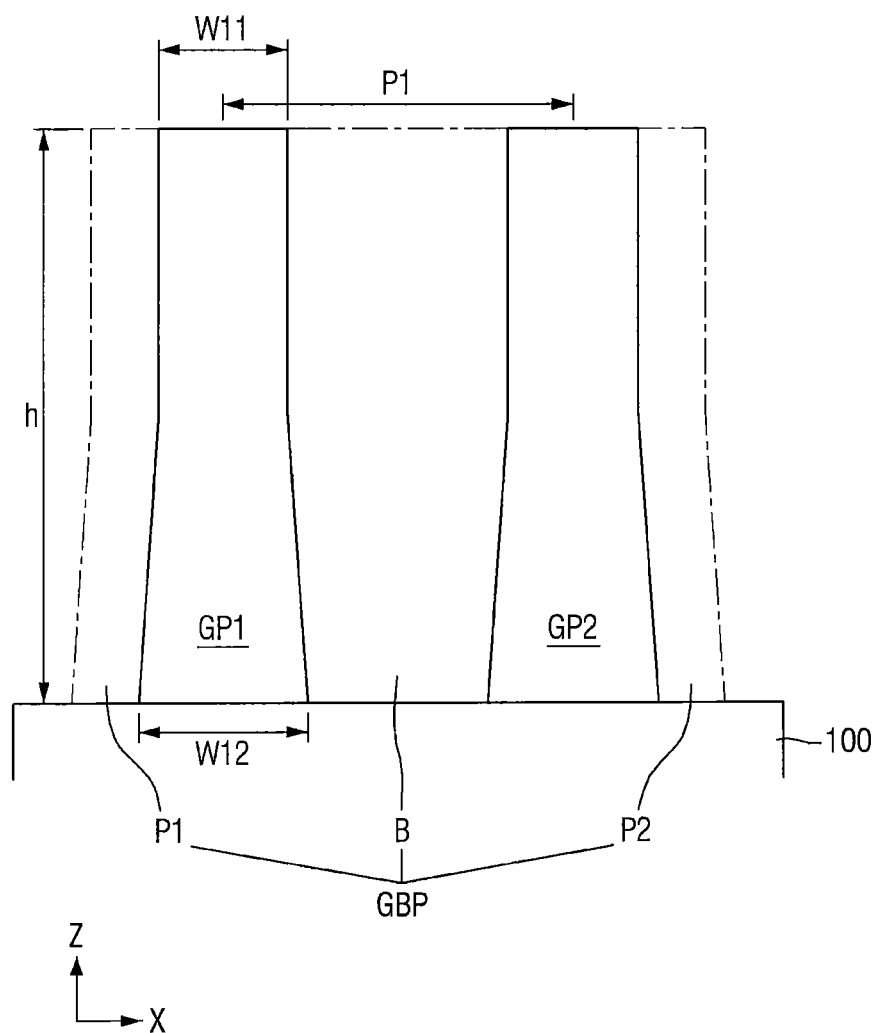
FIGS. 2A and 2B are cross-sectional views taken along the line A-A of FIG. 1.
Figure 2B:
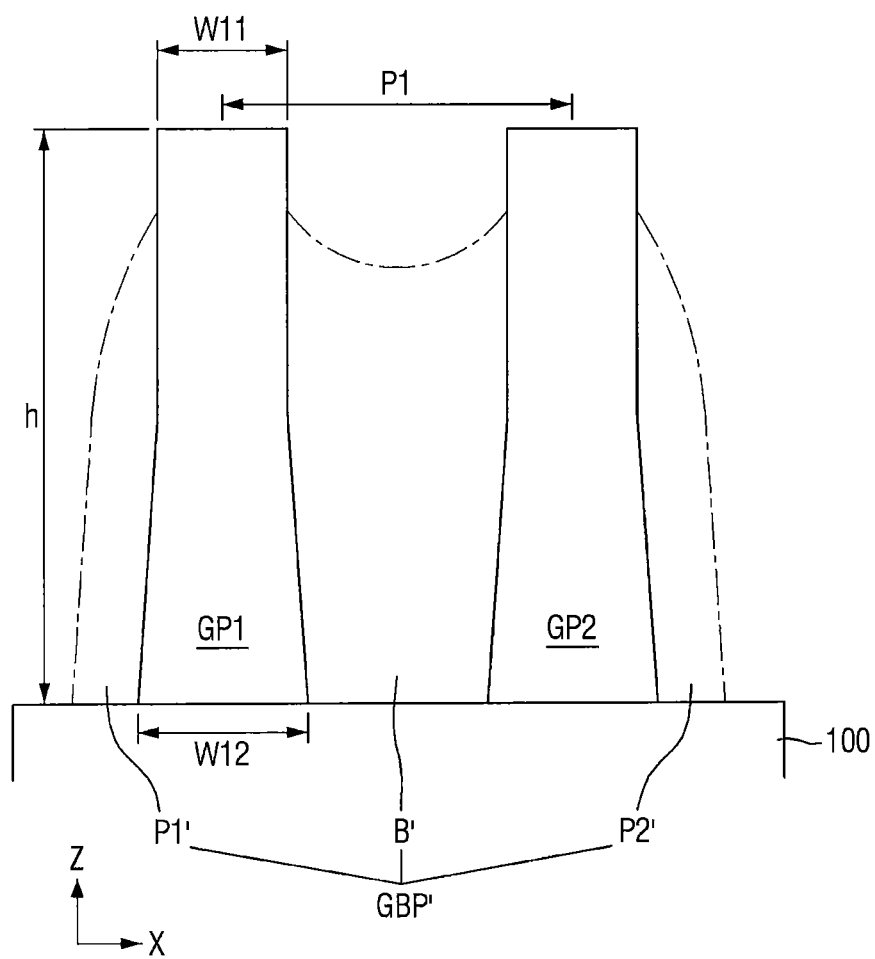

FIG. 1 is a perspective view of a semiconductor device according to embodiments of the inventive concepts. FIGS. 2A and 2B are cross-sectional views taken along the line A-A of FIG. 1.

Referring to FIGS. 1 and 2A, the semiconductor device according to the embodiments of the inventive concepts may include a gate pattern (GP1, GP2 and GBP) and a hard mask pattern HMP. The gate pattern (GP1, GP2 and GBP) may include a first gate electrode GP1, a second gate electrode GP2, and a bridge pattern GBP.

The hard mask pattern HMP may be disposed on the gate pattern (GP1, GP2 and GBP). Specifically, the hard mask pattern HMP may be, but is not limited to, polysilicon, an oxide layer (e.g., $SiO_2$), and/or a nitride layer (e.g., $Si_3N_4$). The hard mask pattern HMP may be used as a mask for etching the gate pattern (GP1, GP2 and GBP).

The gate pattern (GP1, GP2 and GBP) may include a conductive material. In some embodiments, the gate pattern (GP1, GP2 and GBP) may include a metal with high conductivity. In some embodiments, the gate pattern (GP1, GP2 and GBP) may be made of a non-metal such as polysilicon. In addition, the gate pattern (GP1, GP2 and GBP) may be, but is not limited to, a laminate of a metal electrode and/or a silicon electrode. The metal electrode may include, e.g., TiN, and the silicon electrode may include, e.g., amorphous silicon.

Each of the first gate electrode GP1 and the second gate electrode GP2 may extend in a first direction Y. The first gate electrode GP1 and the second gate electrode GP2 may be separated from each other. Specifically, the first gate electrode GP1 and the second gate electrode GP2 may be formed with a first pitch P1. In some embodiments, a width W11 of an upper surface of each of the first gate electrode GP1 and the second gate electrode GP2 may be smaller than a width W12 of a lower surface of each of the first gate electrode GP1 and the second gate electrode GP2.

In the drawings, a cross-section of each of the first gate electrode GP1 and the second gate electrode GP2 is tapered, i.e., becomes wider from the top toward the bottom. However, the shape of the cross-section of each of the first gate electrode GP1 and the second gate electrode GP2 is not limited to the tapered shape. In some embodiments, the cross-section of each of the first gate electrode GP1 and the second gate electrode GP2 may be quadrilateral. In some embodiments, the cross-section of each of the first gate electrode GP1 and the second gate electrode GP2 may be chamfered. That is, corners of each of the first gate electrode GP1 and the second gate electrode GP2 may be rounded.

The bridge pattern GBP may include a first protruding part P1, a second protruding part P2, and a bridge part B. The bridge pattern GBP may extend in a second direction X intersecting the first direction Y. Here, the bridge pattern GBP may be disposed at a first angle θ1 to the first gate electrode GP1 or the second gate electrode GP2. The first angle θ1 may be a right angle or an acute angle.

The bridge part B may be disposed between the first gate electrode GP1 and the second gate electrode GP2 to connect the first gate electrode GP1 and the second gate electrode GP2. An upper surface of the bridge part B may lie, but not limited to, in the same plane with the upper surface of each of the first and second gate electrodes GP1 and GP2.

The first protruding part P1 may protrude outwards from a sidewall of the first gate electrode GP1. The second protruding part P2 may protrude outwards from a sidewall of the second gate electrode GP2. The first protruding part P1 and the second protruding part P2 may be, but are not limited to, symmetric to each other with respect to the bridge part B. However, the first protruding part P1 and the second protruding part P2 are not necessarily symmetric to each other with respect to the bridge part B. As will be described later with reference to other drawings, the first protruding part P1 and the second protruding part P2 can also have different sizes. That is, the bridge pattern GBP can have an asymmetric shape.

In the drawings, a cross-section of each of the first protruding part P1 and the second protruding part P2 is tapered, i.e., becomes wider from the top toward the bottom. However, the shape of the cross-section of each of the first protruding part P1 and the second protruding part P2 is not limited to the tapered shape. In some embodiments, a cross-section of the bridge pattern GBP may be quadrilateral or chamfered.

Referring to FIG. 2B, in some embodiments, a portion of an upper surface of the bridge part B' may be lower than the upper surface of each of the first and second gate electrodes GP1 and GP2. In this case, a width W13 of the bridge part B' which is measured in the first direction Y may be different from the width W12 of each of the first and second gate electrodes GP1 and GP2 which is measured in the second direction X. A cross-section of the bridge part B' may be curved, but the shape of the cross-section of the bridge part B' is not limited to this shape.

The bridge patterns GBP, GBP' may be formed integrally with the first gate electrode GP1 and the second gate electrode GP2 and may include the same material as the first gate electrode GP1 and the second gate electrode GP2. The bridge patterns GBP, GBP' and the first and second gate electrodes GP1 and GP2 may be formed on a substrate 100.

Figure 3:
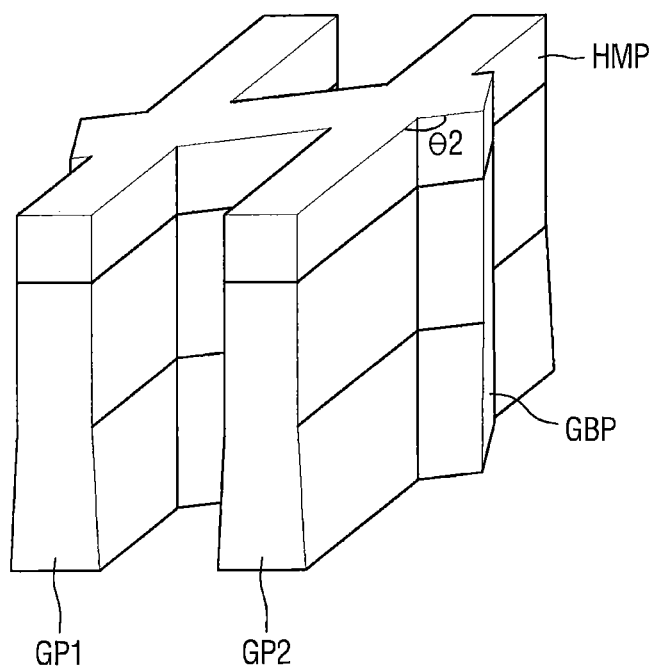
FIG. 3 is a perspective view of a semiconductor device according to embodiments of the inventive concepts.

FIG. 3 is a perspective view of a semiconductor device according to embodiments of the inventive concepts. For ease of description, the following description will focus mainly on differences with FIGS. 1 through 2B.

Referring to FIG. 3, a bridge pattern GBP may be disposed at a second angle θ2 to a first gate electrode GP1 or a second gate electrode GP2. Here, the second angle θ2 may be an obtuse angle and greater than the first angle θ1 described above with reference to FIG. 1.

Figure 8:
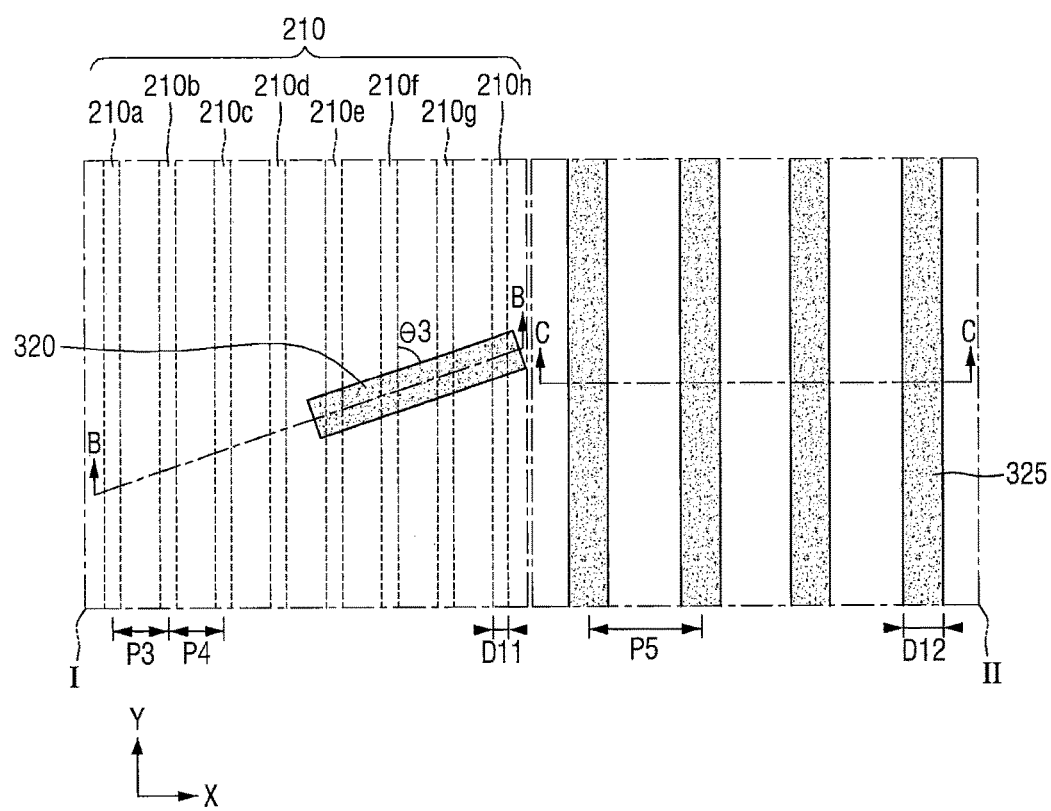

The second angle θ2 may be formed by, but not limited to, the misalignment of a mask pattern of the bridge pattern GBP (e.g. bridge mask pattern 320 in FIG. 8).

In some embodiments, a first protruding part P1 and a second protruding part P2 may be symmetric to each other with respect to a bridge part B. However, the first protruding part P1 and the second protruding part P2 are not necessarily symmetric to each other with respect to the bridge part B. The first protruding part P1 and the second protruding part P2 can also have different sizes. That is, the bridge pattern GBP can have an asymmetric shape.

FIGS. 4 through 13 are views illustrating methods of fabricating semiconductor devices according to embodiments of the inventive concepts.

Figure 4:
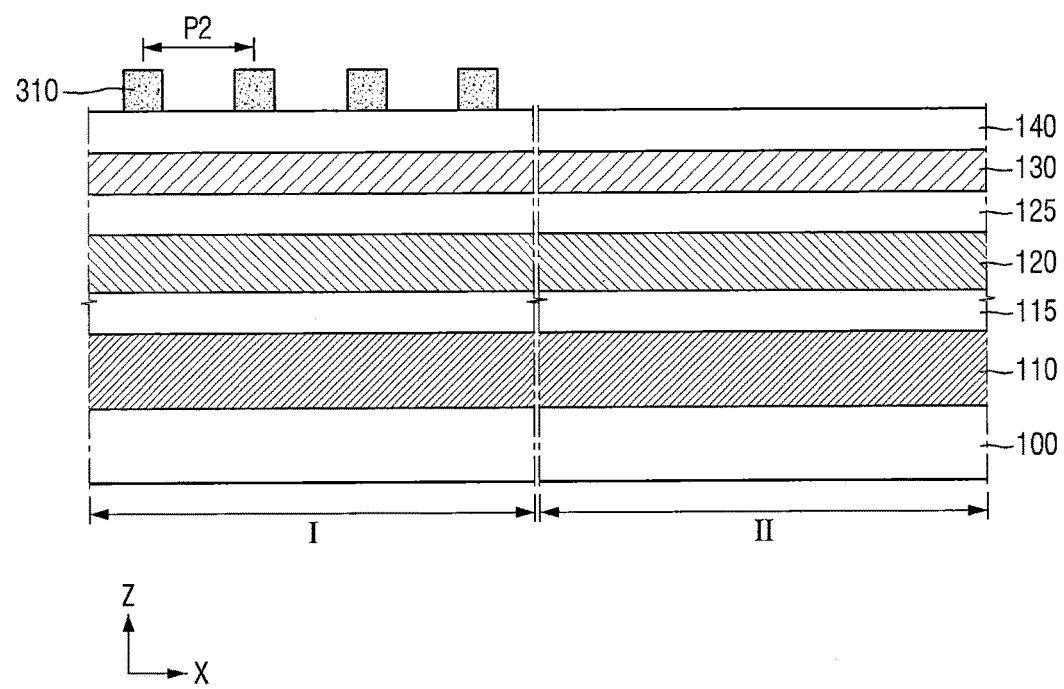
FIGS. 4 through 13 are views illustrating methods of fabricating semiconductor devices according to embodiments of the inventive concepts.

Referring to FIG. 4, a gate layer 110 and a mandrel layer 130 may be sequentially formed on a substrate 100. Here, when a layer is referred to as being "on" another layer, it can be directly on the other layer or intervening layers may be present. In contrast, when a layer is referred to as being "directly on" another layer, there are no intervening layers present.

For example, a first hard mask layer 115, a mask layer 120, and a second hard mask layer 125 may be formed between the gate layer 110 and the mandrel layer 130. However, another mask layer and/or hard mask layer can be additionally used.

The substrate 100 may include a first area I and a second area II. The substrate 100 may be a bulk silicon substrate or a silicon-on-insulator (SOI) substrate. Otherwise, the substrate 100 may be, but is not limited to, a silicon substrate or a substrate made of another material such as silicon germanium, silicon germanium-on-insulator (SGOI), indium antimonide, lead telluride, indium arsenide, indium phosphide, gallium arsenide and/or gallium antimonide.

The gate layer 110 may be formed on the substrate 100. At least part of the gate layer 110 may be removed to form the gate pattern (GP1, GP2 and GBP) described above. The gate layer 110 may include a metal with high conductivity. However, the material that forms the gate layer 110 is not limited to a metal, and the gate layer 110 can also be made of a non-metal such as, for example, polysilicon.

The first hard mask layer 115 may be formed on the gate layer 110. The first hard mask layer 115 may be, but is not limited to, polysilicon, an oxide layer (e.g., $SiO_2$), and/or a nitride layer (e.g., $Si_3N_4$). The first hard mask layer 115 may later be used to form a hard mask pattern HMP for forming the gate pattern (GP1, GP2 and GBP).

The mask layer 120 and the second hard mask layer 125 may be formed on the first hard mask layer 115. The mask layer 120 and the second hard mask layer 125 may have similar etch selectivities. The mask layer 120 may include a similar material to that of the gate layer 110, and the second hard mask layer 125 may include a similar material to that of the first hard mask layer 115. The mask layer 120 and the second hard mask layer 125 may be used as a mask for forming a gate mask pattern.

The mask layer 120 and the second hard mask layer 125 may be used as a sacrificial layer for applying quadruple patterning technology (QPT), but the technical spirit of the inventive concepts is not limited thereto.

The mandrel layer 130 may be formed on the second hard mask layer 125. As will be described herein, multi-patterning may be performed on an area of the mandrel layer 130, which requires a fine fin pitch, using spacers on sidewalls of a mandrel pattern as an etch mask. In an area which requires a finer fin pitch than the above area, spacers may be formed on sidewalls of a resultant structure of an immediately previous patterning process, and patterning may be performed one more using the spacers as an etch mask.

The mandrel layer 130 may be formed on the second hard mask layer 125. The mandrel layer 130 may include a similar material to that of the gate layer 110. The mandrel layer 130 may include a material having a different etch selectivity from the material of the second hard mask layer 125.

A sacrificial film 140 may be formed on the mandrel layer 130. Specifically, the sacrificial film 140 may include amorphous carbon block, spin-on-hard mask (SOH), and/or spin-on-glass (SOG).

A first photoresist 310 may be formed on the sacrificial film 140. The first photoresist 310 may be formed only on the first area I of the substrate 100. Patterns included in the first photoresist 310 may be formed to have a second pitch P2 and extend along the first direction Y. The first photoresist 310 may be used as an etch mask for etching the sacrificial film 140 and/or the mandrel layer 130.

Figure 5:
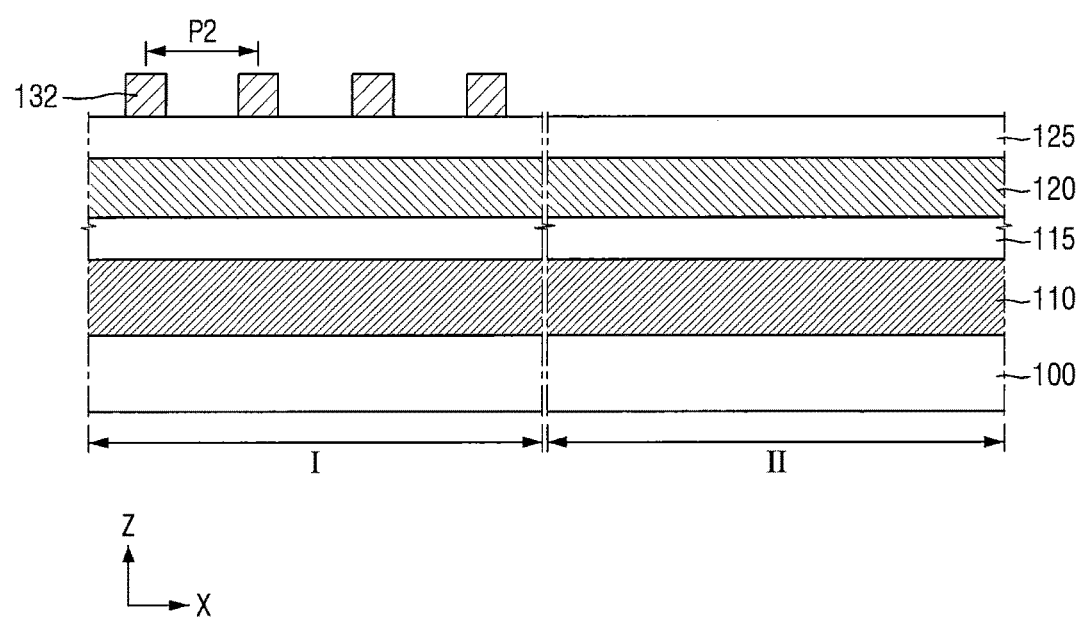

Referring to FIG. 5, a mandrel pattern 132 may be formed by etching the sacrificial film 140 and the mandrel layer 130 using the first photoresist 310 as a mask. Like the first photoresist 310, the mandrel pattern 132 may be formed only on the first area I of the substrate 100. Like the first photoresist 310, the mandrel pattern 132 may be formed to include individual mandrels that have the second pitch P2 and extend along the first direction Y.

Figure 6:
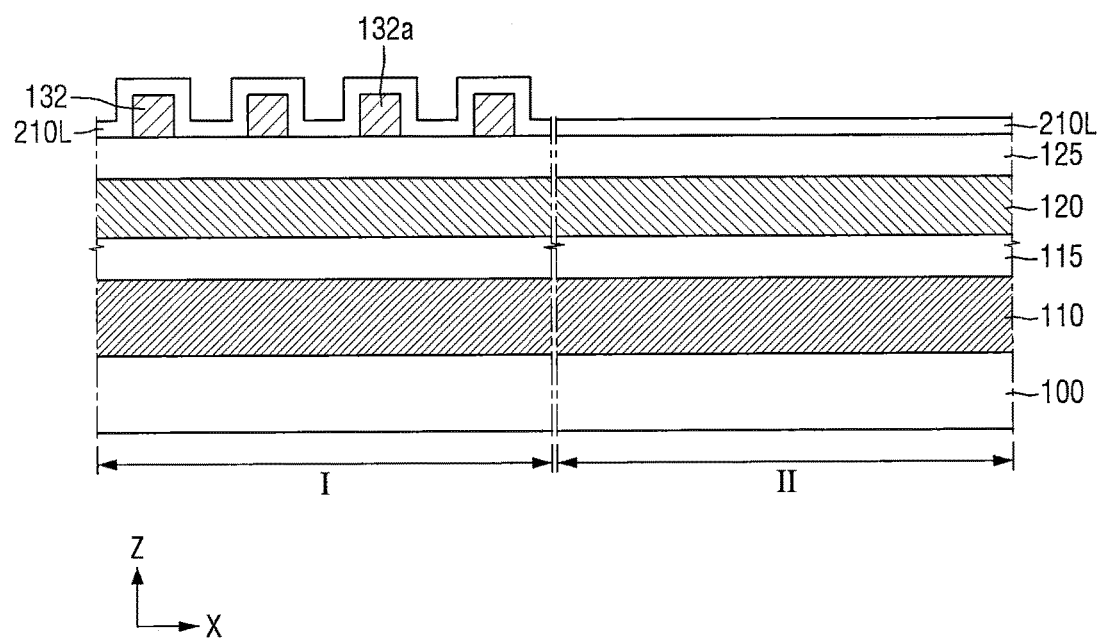

Referring to FIG. 6, a spacer layer 210L may be conformally formed to cover the mandrel pattern 132 and the second hard mask layer 125. The spacer layer 210L may be formed by, e.g., atomic layer deposition (ALD). The spacer layer 210L may cover individual mandrels, such as, for example, first mandrels 132a. In addition, the spacer layer 210L may include, but is not limited to, a nitride layer and/or an oxynitride layer.

Figure 7:
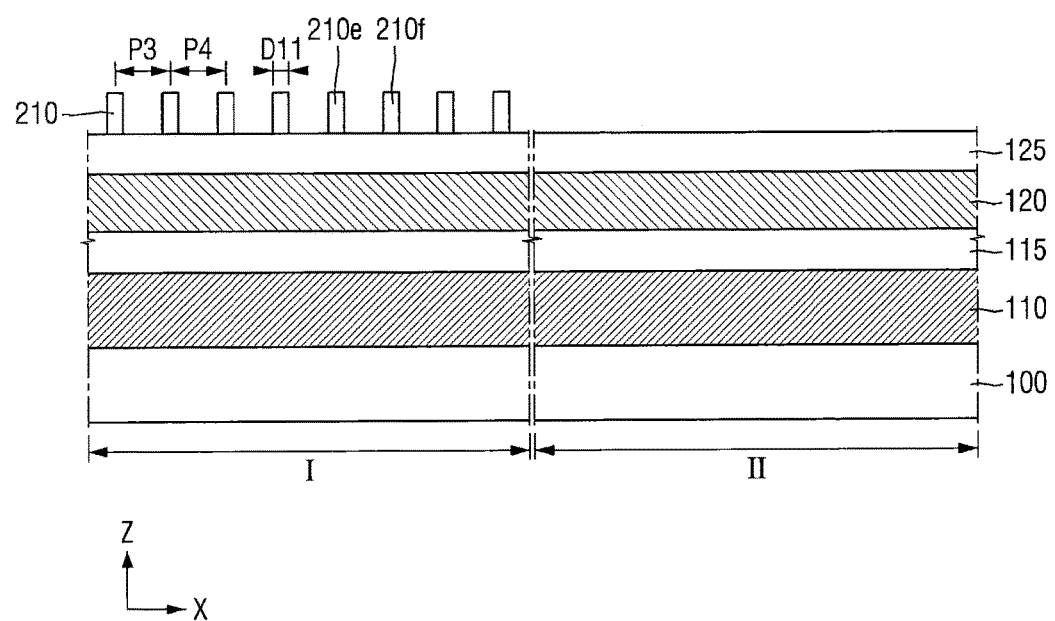

Referring to FIG. 7, the spacer layer 210L formed on the substrate 100 may be partially removed. Through this process, an upper surface of the second hard mask layer 125 may be partially exposed. After the etching process, a spacer pattern 210 may be formed. The spacer pattern 210 may include a first mandrel spacer 210e located on a side of the first mandrels 132a (see FIG. 6) included in the mandrel pattern 132 and a second mandrel spacer 210f located on the other side of the first mandrels 132a (see FIG. 6). That is, the spacer pattern 210 may be disposed on both sidewalls of individual mandrels of the mandrel pattern 132.

However, the inventive concepts are not limited thereto. Although not specifically illustrated in the drawings, one of the first mandrel spacer 210e and/or the second mandrel spacer 210f formed on both sidewalls of the first mandrels 132a may be removed, thereby leaving a mandrel spacer only on one sidewall of the first mandrels 132a.

The spacer pattern 210 may function as a mask for etching the mask layer 120 and the second hard mask layer 125. Therefore, a thickness D11 of the spacer pattern 210 may vary according to a width of a mask pattern that is to be obtained by etching the mask layer 120.

In addition, in some embodiments, first and second pitches P3 and P4 between respective spacers of the spacer pattern 210 may be equal (P3=P4) or different (P3≠P4).

Figure 9:
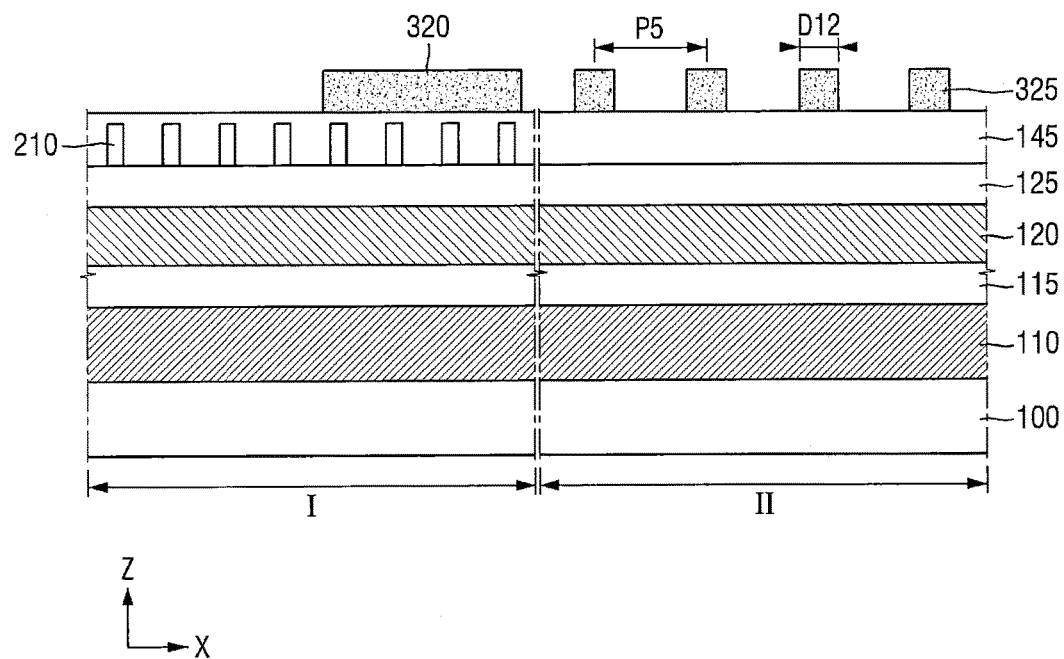

FIG. 8 is a layout view illustrating operations of a method of fabricating semiconductor devices according to embodiments of the inventive concepts. FIG. 9 shows cross-sectional views taken along the lines B-B and C-C of FIG. 8.

Referring to FIGS. 8 and 9, a sacrificial layer 145 may be formed to cover the spacer pattern 210 and the second hard mask layer 125, and a second photoresist (320 and 325) may be formed on the sacrificial layer 145.

The second photoresist (320 and 325) may include a bridge mask pattern 320 which is formed on a first area I and overlaps some of a plurality of spacers included in the spacer pattern 210 and a gate mask pattern 325 which is formed on a second area II.

The bridge mask pattern 320 may overlap a plurality of mandrel spacers included in the spacer pattern 210. Specifically, the bridge mask pattern 320 may overlap part of a first mandrel spacer 210e and part of a second mandrel spacer 210f. For example, the bridge mask pattern 320 may overlap a plurality of mandrel spacers 210e through 210h. In some embodiments, the bridge mask pattern 320 may not overlap all of the mandrel spacers of the spacer pattern 210 (e.g., mandrels spacers 210a through 210d).

The bridge mask pattern 320 may extend in a direction intersecting the first direction Y. Therefore, the bridge mask pattern 320 and the spacer pattern 210 may have a third angle θ3. The third angle θ3 may be, e.g., an acute angle. The third angle θ3 may be formed by, but is not limited to, the misalignment of the bridge mask pattern 320 and the spacer pattern 210.

A side of the bridge mask pattern 320 may be located between the first mandrel spacer 210e and a third mandrel spacer 210d. In this case, the bridge mask pattern 320 may not overlap the third mandrel spacer 210d.

Patterns included in the gate mask pattern 325 may be formed to have a fifth pitch P5 and extend along the first direction Y. The fifth pitch P5 may be greater than a third pitch P3 and a fourth pitch P4 between the mandrel spacers of the spacer pattern 210. The fifth pitch P5 may be equal to the second pitch P2 of the patterns included in the first photoresist 310 described with respect to FIGS. 4 and 5, but the inventive concepts are not limited thereto. Here, a width D12 of each of the patterns included in the gate mask pattern 325 may be greater than the width D11 (see FIG. 7) of each of the mandrel spacers included in the spacer pattern 210. Though FIGS. 8 and 9 illustrate mandrel spacers 210a-210h, it will be understood that this is only an example, and embodiments of the inventive concepts may include greater or fewer mandrel spacers than those illustrated.

Figure 10:
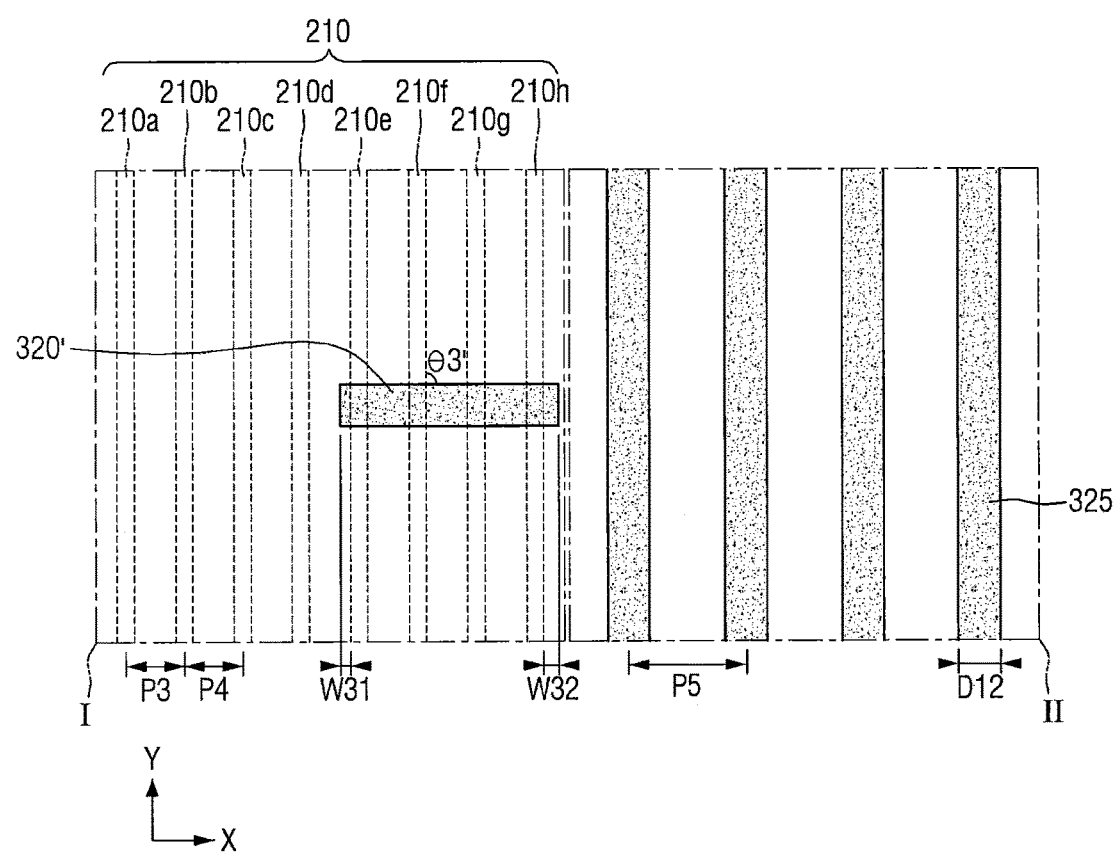

FIG. 10 is a layout view illustrating operations of methods of fabricating semiconductor devices according to embodiments of the inventive concepts. For ease of description, the following description will focus mainly on differences with FIGS. 8 and 9.

Referring to FIG. 10, a bridge mask pattern 320' included in a second photoresist (320' and 325) may extend along the second direction X intersecting the first direction Y. Therefore, the bridge mask pattern 320' and a spacer pattern 210 may have a third angle θ3'. The third angle θ3' may be, but is not limited to, a right angle.

In addition, an end of the bridge mask pattern 320' may be located between a mandrel spacer 210e and a mandrel spacer 210d and protrude outwards from a sidewall of the mandrel spacer 210e by a distance W31. The other end of the bridge mask pattern 320' may protrude outwards from a sidewall of a mandrel spacer 210h by a distance W32. In some embodiments, lengths W31 and W32 of the protruding ends of the bridge mask pattern 320 may be different.

Figure 11:
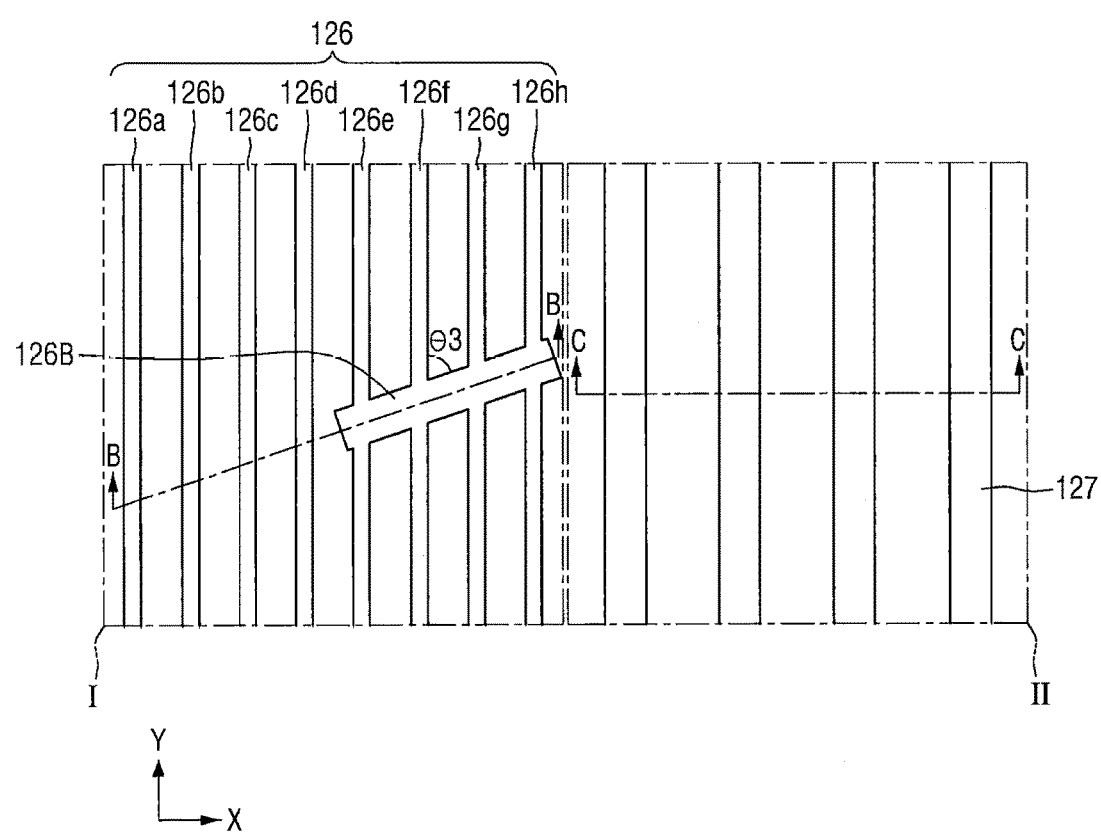
Figure 12:
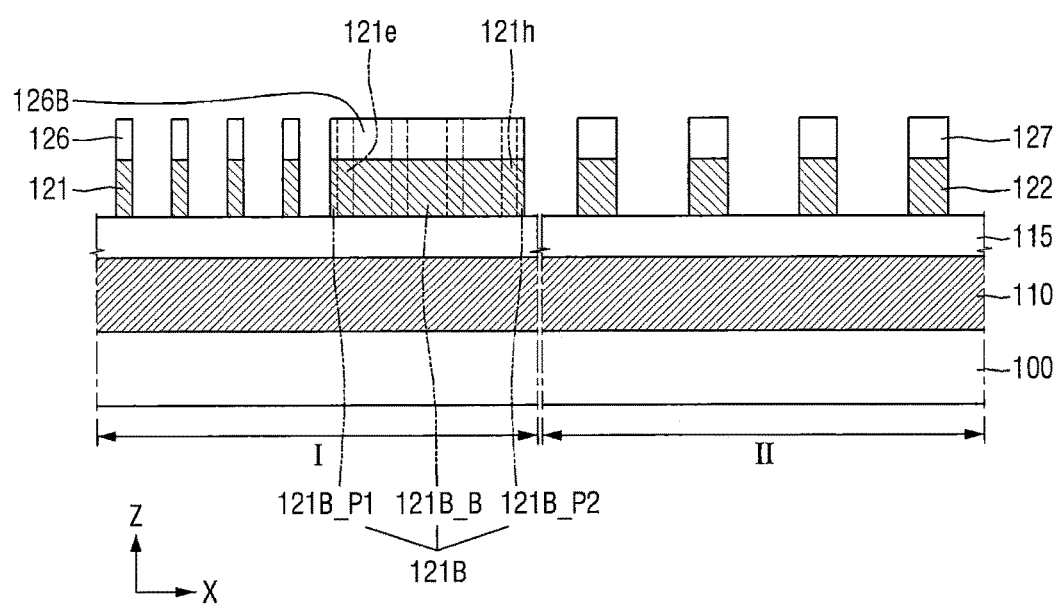

FIG. 11 is a layout view illustrating operations of methods of fabricating semiconductor devices according to embodiments of the inventive concepts. FIG. 12 shows cross-sectional views taken along the lines B-B and C-C of FIG. 11.

Referring to FIGS. 11 and 12, the mask layer 120 and the second hard mask layer 125 may be at least partially removed using the spacer pattern 210 and the second photoresist (320 and 325) as a mask.

Accordingly, a mask pattern (121, 121B and 122) may be formed in the mask layer 120. The mask pattern (121, 121B and 122) may include a first mask pattern (121 and 121B) formed on a first area I of the substrate 100 and a second mask pattern 122 formed on a second area II of the substrate 100.

The first mask pattern (121 and 121B) may include a plurality of gate mask patterns 121 which extend in the first direction Y and a bridge pattern 121B which connects a plurality of gate mask patterns 121e through 121h. The second mask pattern 122 may include a plurality of gate mask patterns which extend in the first direction Y.

The bridge pattern 121B may extend in a direction intersecting the first direction Y. Therefore, the bridge pattern 121B may, and the gate mask patterns 121e through 121h may, have a third angle θ3. The third angle θ3 may be an acute angle. However, the third angle θ3 is not limited to the acute angle and may also be a right angle or an obtuse angle.

The bridge pattern 121B may be formed integrally with the gate mask patterns 121e through 121h. The bridge pattern 121B may include the same material as the gate mask patterns 121e through 121h.

In addition, the bridge pattern 121B may include a first protruding part 121B_P1 which protrudes outwards from a sidewall of the gate mask pattern 121e and a second protruding part 121B_P2 which protrudes outwards from a sidewall of the gate mask pattern 121h. Here, the first protruding part 121B_P1 and the second protruding part 121B_P2 may have the same size or different sizes.

The gate mask patterns included in the second mask pattern 122 may be substantially identical to the patterns included in the gate mask pattern 325 of the second photoresist 320 and 325 described above with reference to FIGS. 8 and 9.

The second hard mask layer 125 may be disposed on the mask layer 120 and formed in substantially the same shape as the mask pattern (121, 121B and 122) of the mask layer 120 to form second hard mask patterns 126, 126B, and 127.

Figure 13:
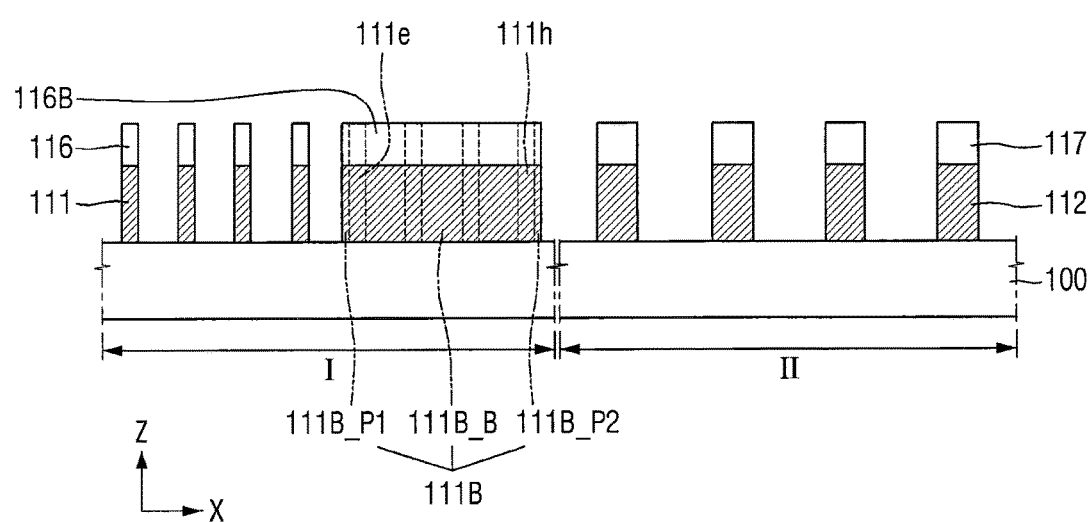

Referring to FIG. 13, a gate layer 110 and a first hard mask layer 115 may be at least partially removed using the patterns formed in the mask layer 120 (e.g., mask patterns 121, 121B and 122) and the second hard mask layer 125 (e.g., hard mask patterns 126, 126B and 127) as a mask.

Accordingly, a gate pattern (111 and 112) may be formed in the gate layer 110. The gate pattern (111 and 112) may include a first gate pattern 111 which is formed on the first area I of the substrate 100 and a second gate pattern 112 which is formed on the second area II of the substrate 100. The first gate pattern 111 may include a plurality of first gate electrodes which extend in the first direction Y and a bridge part 111B which connects a plurality of the gate electrodes, such as gate electrodes 111e through 111h. The second gate pattern 112 may include a plurality of gate electrodes which extend in the first direction Y.

The bridge part 111B may extend in a direction intersecting the first direction Y. The bridge part 111B may be formed integrally with the gate electrodes 111e through 111h. Therefore, the bridge part 111B may include the same material as the gate electrodes 111e through 111h.

The bridge part 111B may include a first protruding part 111B_P1 which protrudes outwards from a sidewall of the gate electrode 111e and a second protruding part 111B_P2 which protrudes outwards from a sidewall of the gate electrode 111h. Here, the first protruding part 111B_P1 and the second protruding part 111B_P2 may have the same size or different sizes. In addition, the bridge part 111B may include a connecting part 111B_B which connects the gate electrodes 111e through 111h.

The gate electrodes included in the second gate pattern 112 may be substantially identical in shape to the gate mask patterns included in the second mask pattern 122 described above with reference to FIGS. 11 and 12.

The first hard mask layer 115 may be disposed on the gate layer 110 and may be at least partially removed to form first hard mask patterns 116, 116B, and 117 in substantially the same shape as the gate pattern (111 and 112). The first hard mask layer 115 may later be removed by an etching process.

Figure 14:
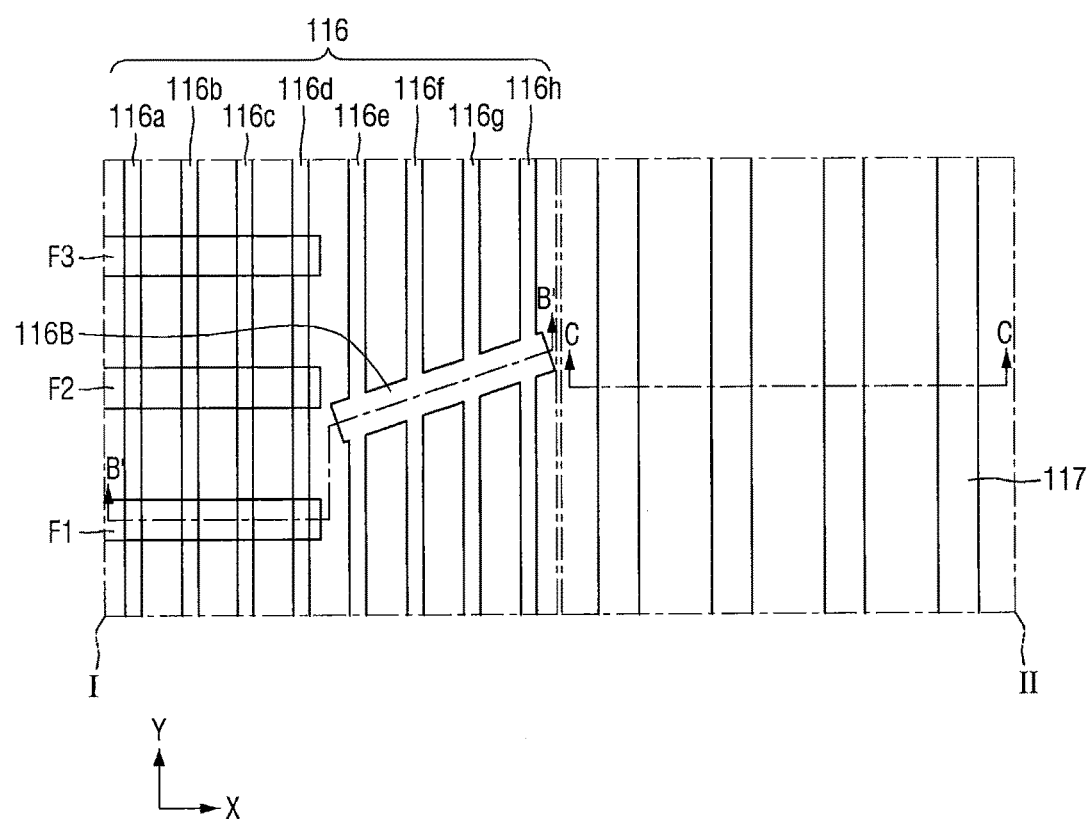
FIG. 14 is a layout view of a semiconductor device according to embodiments of the inventive concepts.
Figure 15:
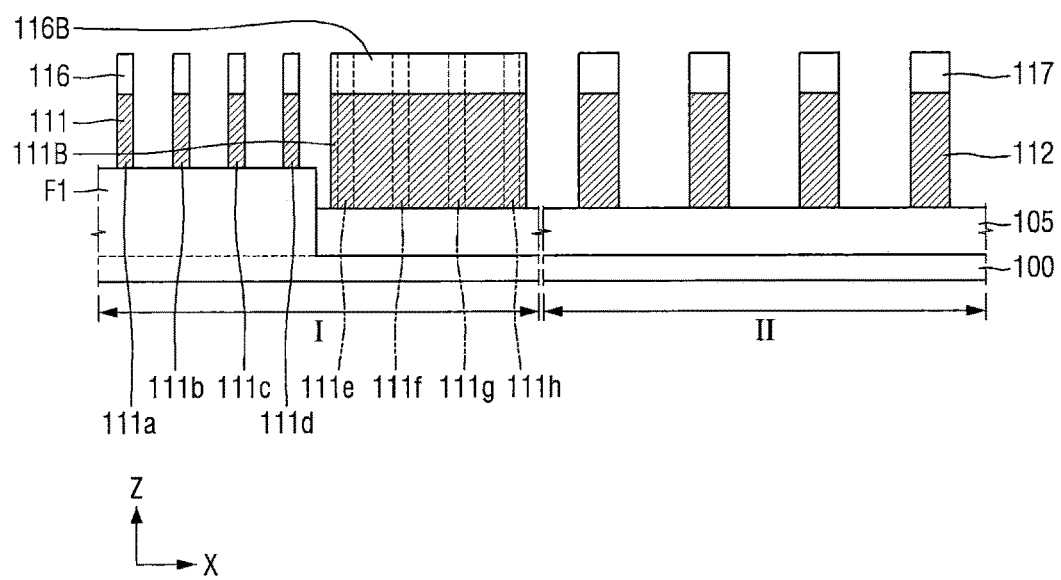
FIG. 15 shows cross-sectional views taken along the lines B'-B' and C-C of FIG. 14.

FIG. 14 is a layout view of a semiconductor device according to embodiments of the inventive concepts. FIG. 15 shows cross-sectional views taken along the lines B'-B' and C-C of FIG. 14. For ease of description, the following description focuses mainly on differences with FIG. 13.

Referring to FIGS. 14 and 15, the semiconductor device may include first through third fin patterns F1 through F3 formed on a substrate 100. The first through third fin patterns F1 through F3 may protrude from the substrate 100. The first through third fin patterns F1 through F3 may extend side by side with each other and may be separated from each other. The first through third fin patterns F1 through F3 may extend along the second direction X. Each of the first through third fin patterns F1 through F3 may be part of the substrate 100 and include an epitaxial layer grown from the substrate 100.

A field insulating layer 105 may be formed on the substrate 100. In addition, the field insulating layer 105 may be formed between the first through third fin patterns F1 through F3.

The field insulating layer 105 may partially cover sidewalls of the first through third fin patterns F1 through F3. In some embodiments, the field insulating layer 105 may cover lower parts of the sidewalls of the first and second fin patterns F1 and F2 and an upper surface of the substrate 100.

In some embodiments, some 111a through 111d of the gate electrodes 111a through 111h included in the first gate pattern 111 described above with reference to FIGS. 12 and 13 may be disposed on the first fin pattern F1. The other gate electrodes 111e through 111h of the first gate pattern 111 and the bridge part 111B may be disposed on the field insulating layer 105. That is, the bridge part 111B may not be located on the first through third fin patterns F1 through F3. The bridge part 111B may be disposed to not overlap the first through third fin patterns F1 through F3.

The bridge part 111B may be used to support gate electrodes with a narrow pitch. Accordingly, the bridge part 111B can prevent the leaning of the gate electrodes (e.g., gate electrodes 111e through 111h) and improve a leaning margin in semiconductor devices according to embodiments of the inventive concepts.

In a method of fabricating semiconductor devices according to embodiments of the inventive concepts, patterns of semiconductor devices can be formed to have various pitches using a QPT process. The QPT process is a process of repeating a double patterning technology (DPT) process. The QPT process has been developed to form fine patterns of a highly integrated semiconductor device and can be used to implement fine patterns in a ten nanometer (nm) range.

However, patterns formed using the QPT process have a finer width and pitch than patterns formed using a conventional process. Therefore, it is not easy to control the pitch between the patterns. That is, in a fin cut process for controlling a pitch between patterns, it is difficult to achieve accurate overlay of mask patterning for removing a pitch in a particular area. This is because a process margin is small due to a fine pitch between patterns.

A method of forming semiconductor patterns according to an embodiment of the inventive concepts does not require a process of adjusting a gap between formed patterns using, e.g., a fin cut process. That is, in the method of forming semiconductor patterns according to the embodiment of the inventive concepts, patterns with various pitches can be formed in the QPT process.

The above description related to the QPT process is merely an example used to explain the technical spirit of the inventive concepts. Therefore, the technical spirit of the inventive concepts is not limited to the above description. That is, the technical spirit of the inventive concepts can also be applied to a pattern forming process that does not use the QPT process.

Figure 16:
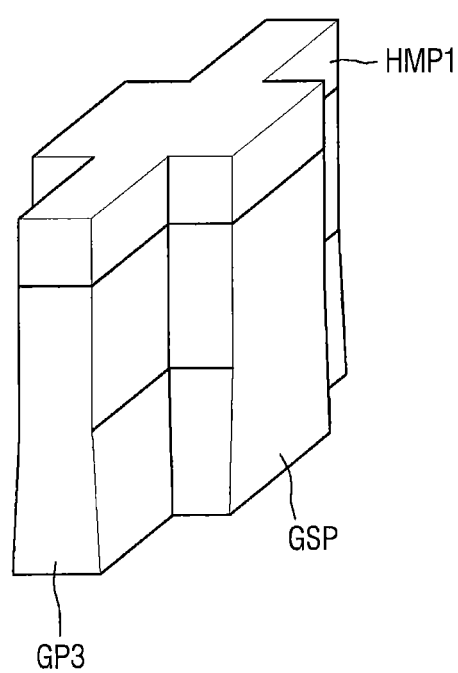
FIG. 16 is a perspective view of a semiconductor device according to embodiments of the inventive concepts.
Figure 16:
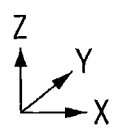

FIG. 16 is a perspective view of a semiconductor device according to embodiments of the inventive concepts. For ease of description, the following description will focus mainly on differences with FIGS. 1 through 2B.

Referring to FIG. 16, a semiconductor device according to the embodiments of the inventive concepts may include a gate pattern (GP3 and GSP) and a hard mask pattern HMP1. The gate pattern (GP3 and GSP) may include a gate electrode GP3 and a support part GSP.

The hard mask pattern HMP1 may be disposed on the gate pattern (GP3 and GSP). Specifically, the hard mask pattern HMP1 may be, but is not limited to, polysilicon, an oxide layer (e.g., $SiO_2$), and/or a nitride layer (e.g., $Si_3N_4$). The hard mask pattern HMP1 may be used as a mask for etching the gate pattern (GP3 and GSP).

The gate electrode GP3 may extend in the first direction Y.

The support part GSP may include a first protruding part and a second protruding part. The first protruding part may protrude outwards from a sidewall of the gate electrode GP3, and the second protruding part may protrude outwards from the other sidewall of the gate electrode GP3. The first protruding part and the second protruding part may be, but are not limited to, symmetric to each other with respect to the gate electrode GP3. However, the first protruding part and the second protruding part are not necessarily symmetric to each other with respect to the gate electrode GP3. As will be described later with reference to other drawings, the first protruding part and the second protruding part can also have different sizes. That is, the support part GSP can have an asymmetric shape.

An upper surface of the support part GSP may lie in the same plane with an upper surface of the gate electrode GP3, but the inventive concepts are not limited thereto.

In FIG. 16, a cross-section of each of the first protruding part and the second protruding part of the support part GSP is tapered, i.e., may become wider from the top toward the bottom. However, the shape of the cross-section of each of the first protruding part and the second protruding part is not limited to the tapered shape. In some embodiments, a cross-section of the support part GSP may be quadrilateral or chamfered.

In addition, although not specifically illustrated in FIG. 16, a portion of the upper surface of the support part GSP may be, but is not limited to, lower than the upper surface of the gate electrode GP3.

FIGS. 17 through 22 are views illustrating methods of fabricating semiconductor devices according to embodiments of the inventive concepts. FIGS. 17 through 22 illustrate operations subsequent to the operations of the methods of fabricating semiconductor devices described herein with reference to FIGS. 4 through 7. For ease of description, the following description will focus mainly on differences with FIGS. 8 through 15.

Figure 17:
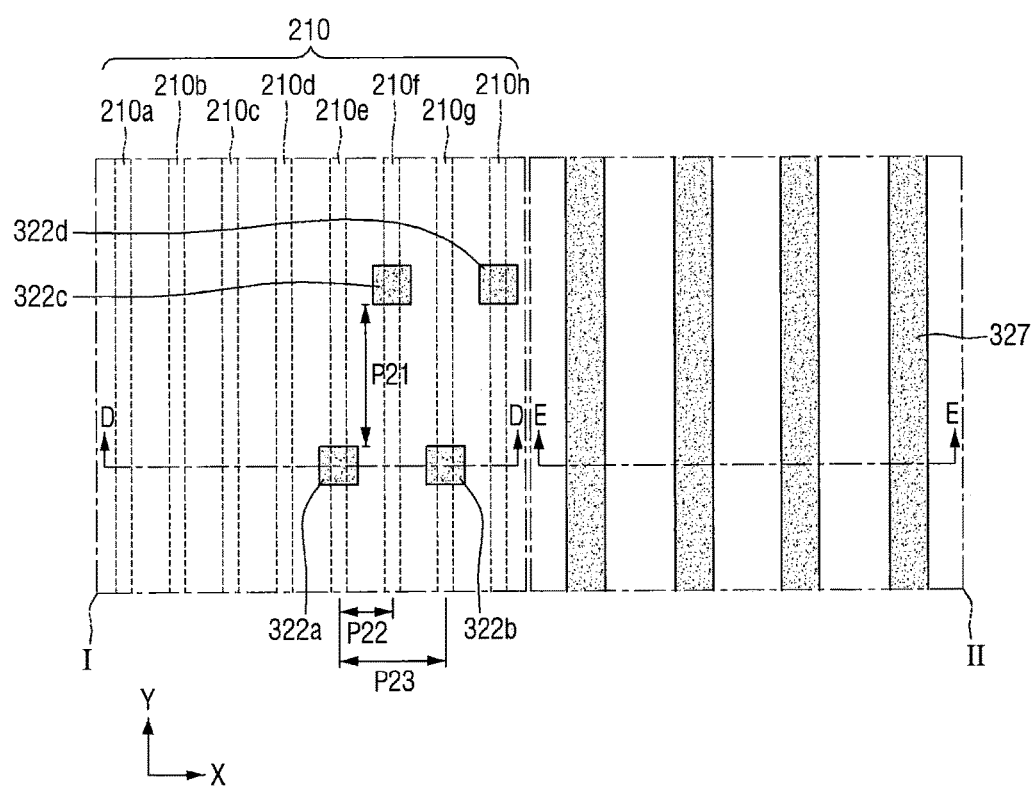
FIGS. 17 through 22 are views illustrating a method of fabricating a semiconductor device according to embodiments of the inventive concepts.
Figure 18:
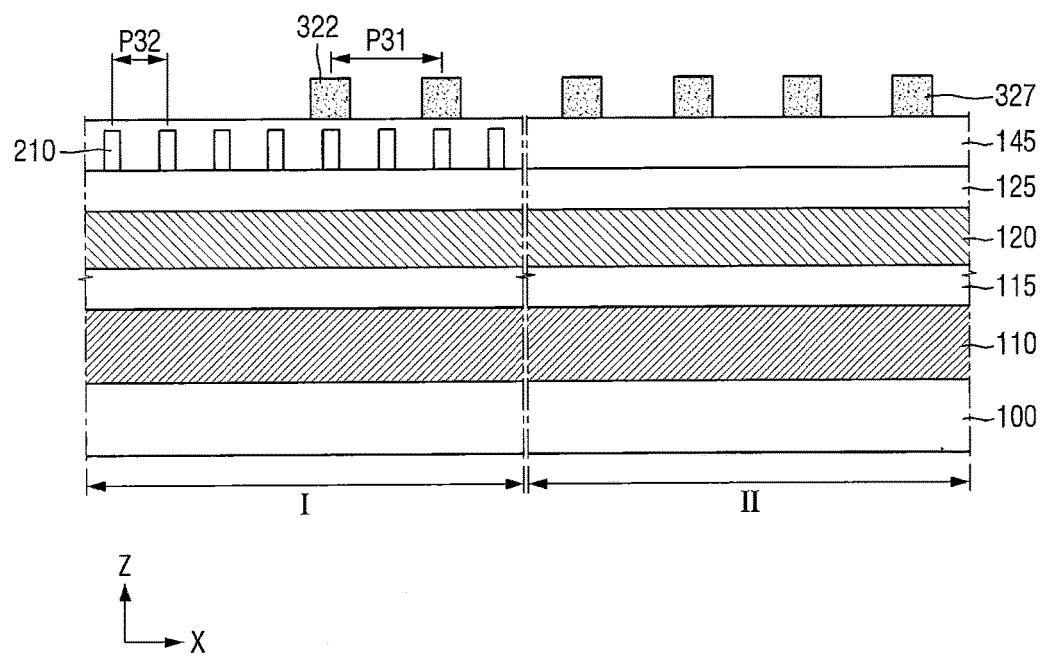

Referring to FIGS. 17 and 18 subsequent to FIG. 7, a sacrificial layer 145 may be formed to cover a mandrel spacer pattern 210 and a second hard mask layer 125, and a second photoresist (322 and 327) may be formed on the sacrificial layer 145.

The second photoresist (322 and 327) may include a support mask pattern 322 which is formed on a first area I and overlaps some of a plurality of spacers included in the mandrel spacer pattern 210, and a gate mask pattern 327 which is formed on a second area II.

The support mask pattern 322 may include a plurality of support patterns 322a through 322d. For example, a first support pattern 322a may partially overlap a first mandrel spacer 210e and may not overlap the other mandrel spacers. A second support pattern 322b may partially overlap a mandrel spacer 210g and may not overlap the other mandrel spacers. A third support pattern 322c may partially overlap a mandrel spacer 210f and may not overlap the other mandrel spacers.

The first support pattern 322a may be separated from the second and third support patterns 322b and 322c.

Here, a pitch P21 between the first support pattern 322a and the third support pattern 322c in the first direction Y may be greater than a pitch P22 between adjacent mandrel spacers in the second direction X. In addition, a pitch P23 between the first support pattern 322a and the second support pattern 322b in the second direction X may be greater than the pitch P22 between adjacent mandrel spacers in the second direction X.

Here, a width of the first support pattern 322a which is measured in the second direction X may be greater than a width of a mandrel spacer which is measured in the second direction X.

Figure 19:
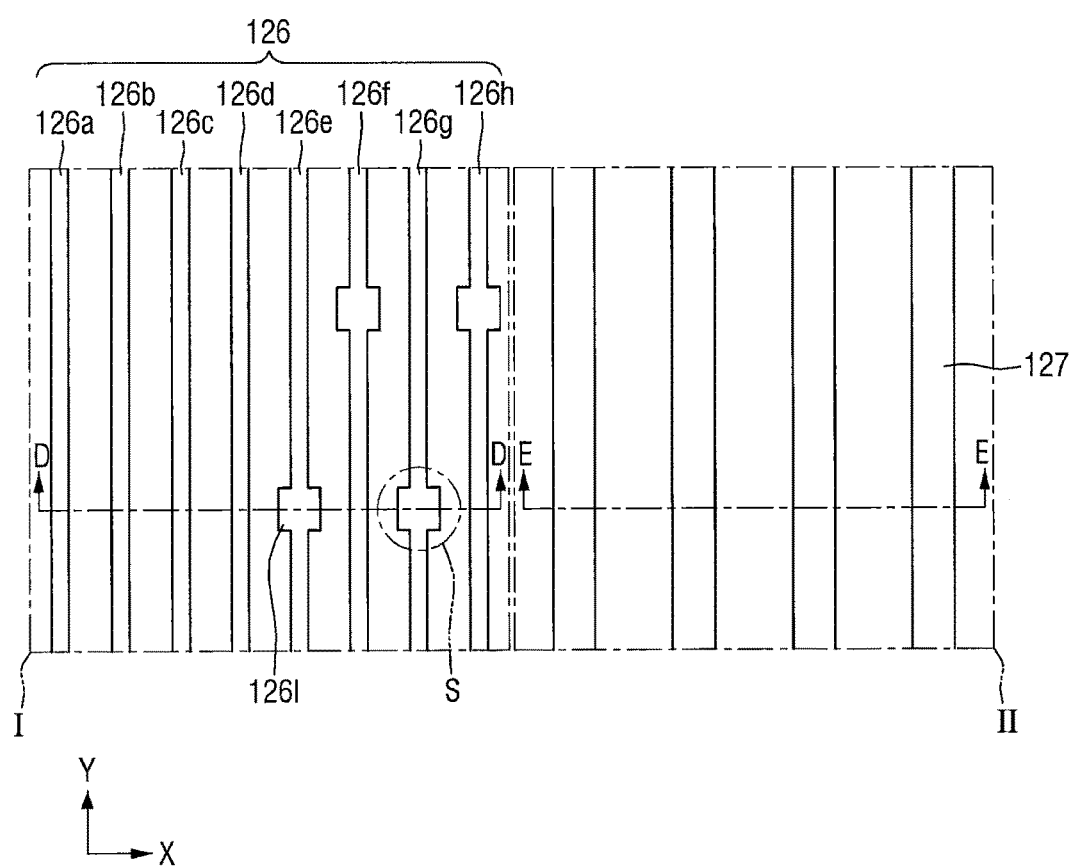
Figure 20:
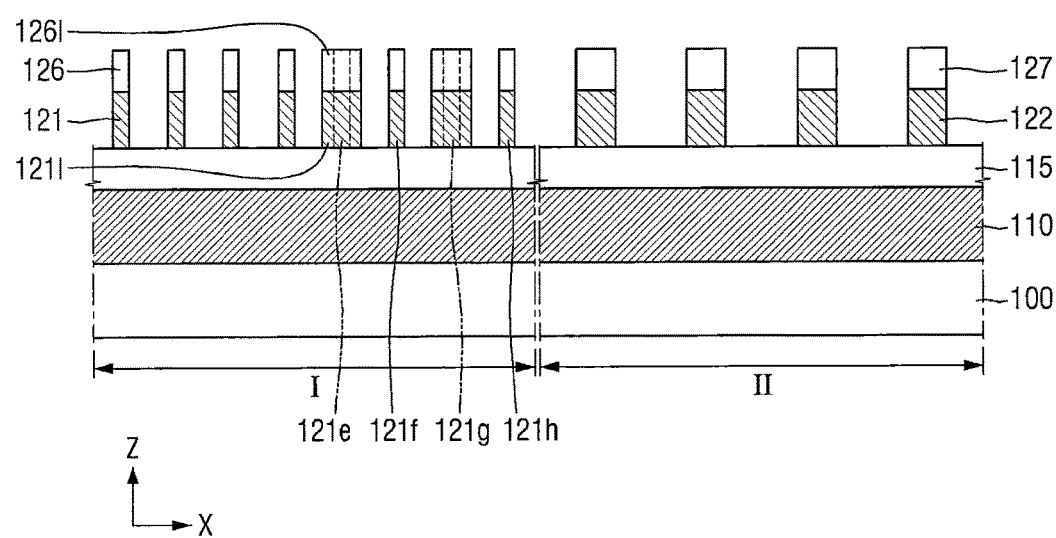

Referring to FIGS. 19 and 20, a mask layer 120 and the second hard mask layer 125 may be at least partially removed using the mandrel spacer pattern 210 and the second photoresist (322 and 327) as a mask. FIG. 20 shows cross-sectional views taken along the lines D-D and E-E of FIG. 19.

Accordingly, a mask pattern (121 and 122) may be formed in the mask layer 120. The mask pattern (121 and 122) may include a first mask pattern 121 which is formed on the first area I of a substrate 100 and a second mask pattern 122 which is formed on the second area II of the substrate 100. The first mask pattern 121 may include a plurality of support patterns 121I, each connected to any one of a plurality of gate mask patterns, e.g., gate mask patterns 121e through 121h, extending in the first direction Y.

The second mask pattern 122 may include a plurality of gate mask patterns extending in the first direction Y.

The second hard mask layer 125 may be disposed on the mask layer 120 and may be at least partially removed to form second hard mask patterns (126 and 127), including support mask patterns 126I, formed in substantially the same shape as the mask pattern (121and 122), including support patterns 121I.

Figure 21A:
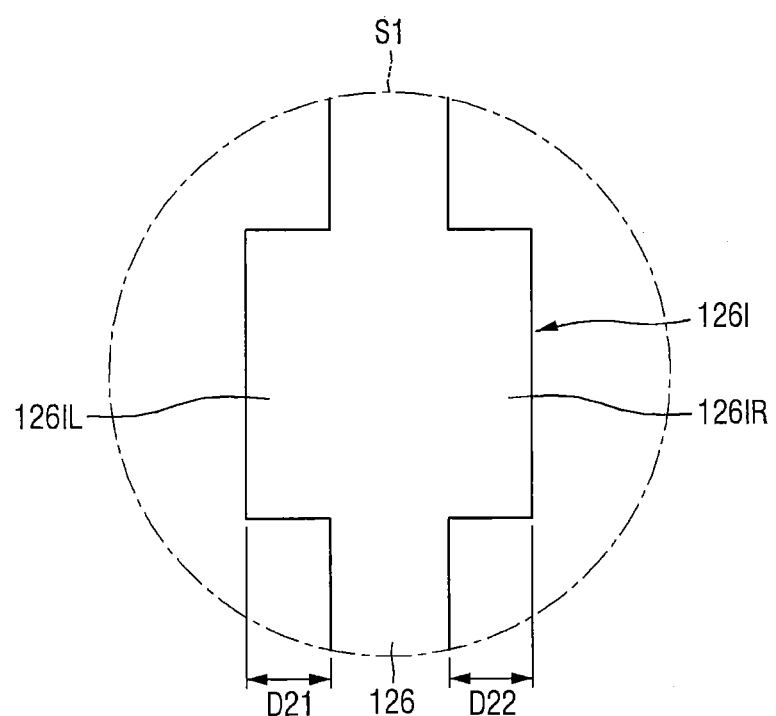
Figure 21B:
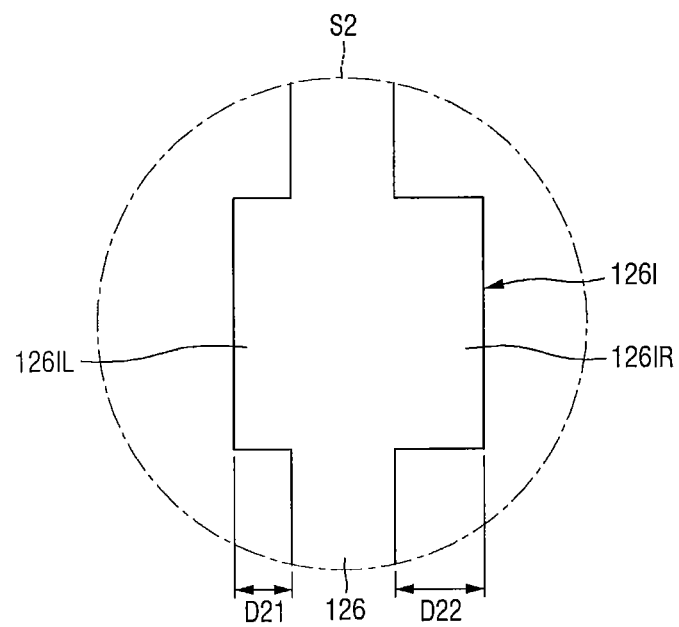
Figure 21C:
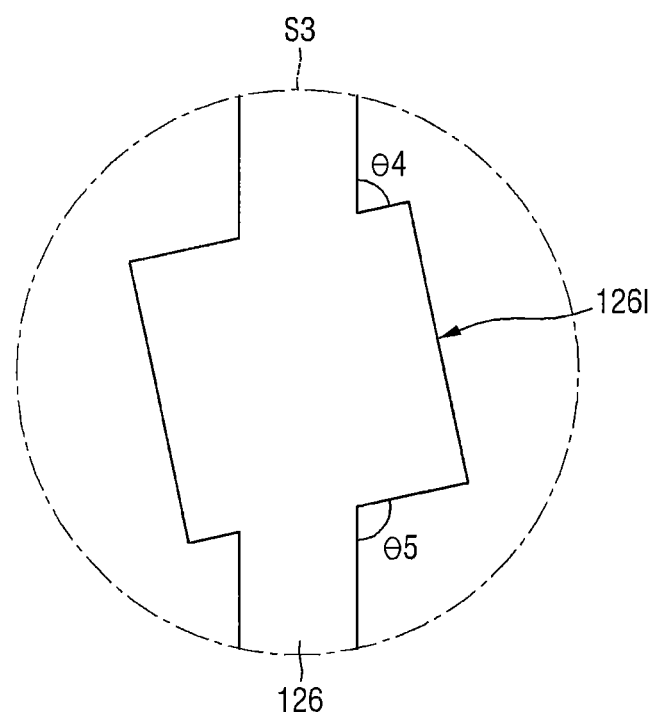

FIGS. 21A through 21C illustrate enlarged views of various embodiments of an area 'S' of FIG. 19. Support patterns will now be described in detail with reference to FIGS. 21A through 21C.

Referring to FIG. 21A, a support mask pattern 126I may include a first protruding part 126IL which protrudes outwards a distance D21 from a sidewall of a second hard mask pattern 126 and a second protruding part 126IR which protrudes a distance D22 outwards from the other sidewall of the second hard mask pattern 126. In some embodiments, the first protruding part 126IL and the second protruding part 126IR may have the same size. That is, the support mask pattern 126I may be symmetric with respect to the second hard mask pattern 126, and the distance D21 may be equal to the distance D22.

However, the inventive concepts are not limited thereto. Referring to FIG. 21B, the first protruding part 126IL and the second protruding part 126IR of the support mask pattern 126I may have different sizes. In some embodiments, the first protruding part 126IL may protrude outwards from a sidewall of a second hard mask pattern 126 a distance D21 that is different from the distance D22 by which the second protruding part 126IR protrudes outwards from the other sidewall of the second hard mask pattern 126. That is, the support mask pattern 126I may be asymmetric with respect to the second hard mask pattern 126.

In addition, referring to FIG. 21C, the support mask pattern 126I and the second hard mask pattern 126 may have a fourth angle θ4. The support mask pattern 126I may be rotated by a specific angle with respect to the second hard mask pattern 126. That is, the support mask pattern 126I and the second hard mask pattern 126 may be misaligned with each other. The fourth angle θ4 may be, but is not limited to, an acute angle.

Referring back to FIGS. 19 and 20, each of the support patterns 121I may be formed integrally with any one of the gate mask patterns 121e through 121h. The support patterns 121I may include the same material as a plurality of gate mask patterns 121e through 121h.

Figure 22:
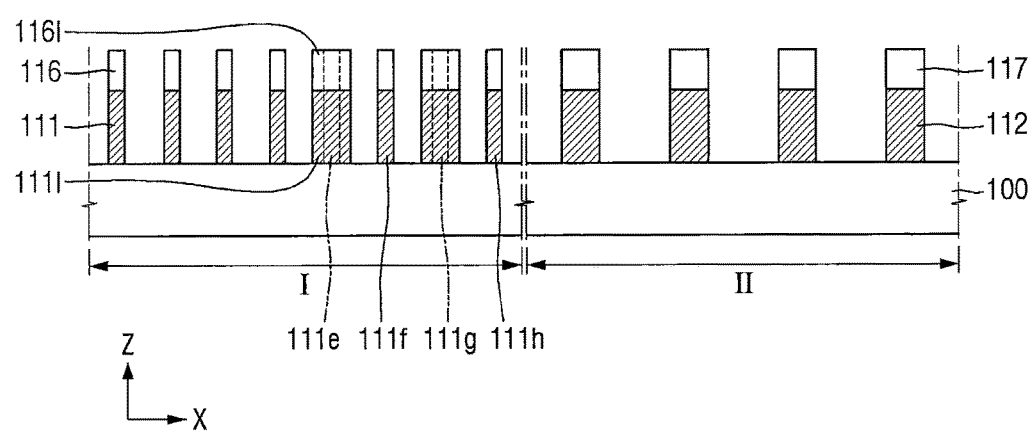

Referring to FIG. 22, a gate layer 110 and a first hard mask layer 115 may be at least partially removed using the mask layer 120 and the second hard mask layer 125 as a mask.

Accordingly, a gate pattern (111 and 112) may be formed in the gate layer 110. The gate pattern (111 and 112) may include a first gate pattern 111 which is formed on the first area I of the substrate 100 and a second gate pattern 112 which is formed on the second area II. The first gate pattern 111 may include a plurality of gate electrodes 111e through 111h which extend in the first direction Y and a plurality of support parts 111I, each connected to any one of the gate electrodes 111e through 111h. The second gate pattern 112 may include a plurality of gate electrodes which extend in the first direction Y.

The support parts 111I may extend in a direction intersecting the first direction Y. The support parts 111I may be formed in substantially the same shape as the support patterns described above with reference to FIGS. 19 through 21C.

Each of the support parts 111I may be formed integrally with any one of the gate electrodes 111e through 111h. That is, the support parts 111I may include the same material as the gate electrode 111e through 111h.

The gate electrodes included in the second gate pattern 112 may be substantially identical in shape to the gate mask patterns included in the second mask pattern 122 described above with reference to FIGS. 19 and 20.

The first hard mask layer 115 may be disposed on the gate layer 110 and at least partially removed to form first hard mask patterns (116 and 117), and first hard mask support patterns 116I, formed in substantially the same shape as the gate pattern (111 and 112) and support parts 111I of gate layer 110. The first hard mask layer 115 may later be removed by an etching process.

The support parts 111I may be used to support gate electrodes with a narrow pitch. Accordingly, the support parts 111I can prevent the leaning of the gate electrodes and improve a leaning margin in semiconductor devices according to embodiments.

Figure 23:
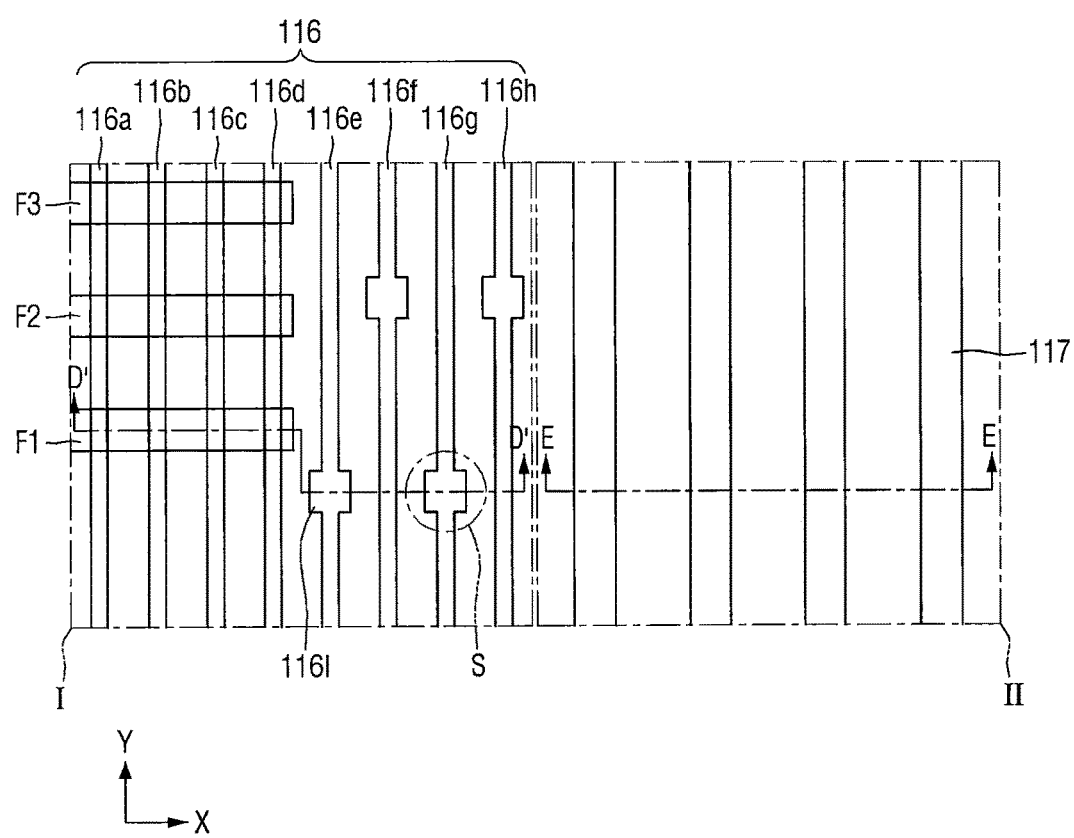
FIG. 23 is a layout view of a semiconductor device according to embodiments of the inventive concepts.
Figure 24:
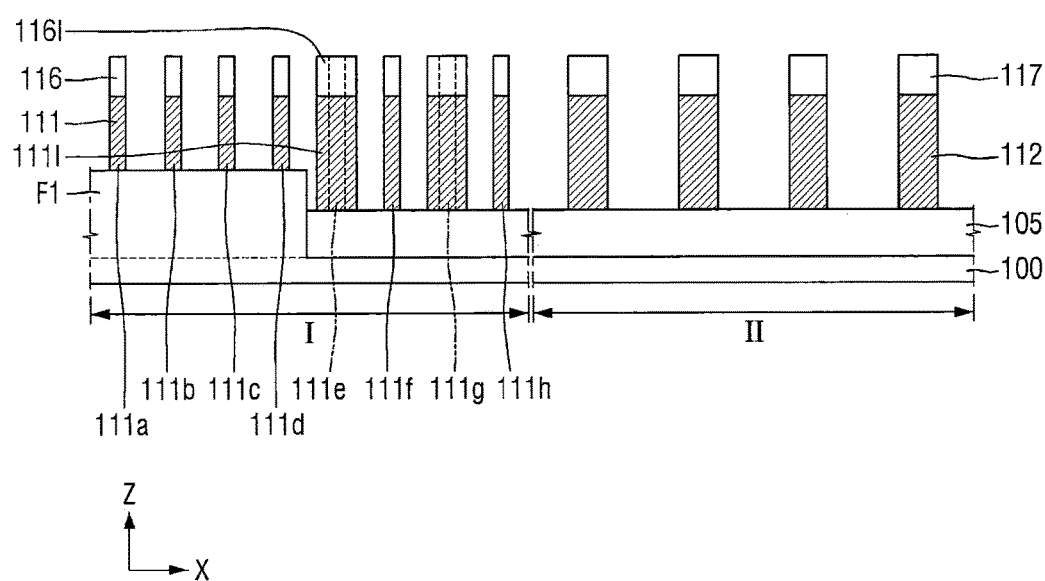
FIG. 24 shows cross-sectional views taken along the lines D'-D' and E-E of FIG. 23.

FIG. 23 is a layout view of a semiconductor device according to embodiments of the inventive concepts. FIG. 24 shows cross-sectional views taken along the lines D'-D' and E-E of FIG. 23. For ease of description, the following description will focus mainly on differences with FIG. 22.

Referring to FIGS. 23 and 24, the semiconductor device may include first through third fin patterns F1 through F3 formed on a substrate 100. The first through third fin patterns F1 through F3 may protrude from the substrate 100.

A field insulating layer 105 may be formed on the substrate 100. In addition, the field insulating layer 105 may be formed between the first through third fin patterns F1 through F3.

The field insulating layer 105 may partially cover sidewalls of the first through third fin patterns F1 through F3. In some embodiments, the field insulating layer 105 may cover lower parts of the sidewalls of the first and second fin patterns F1 and F2 and an upper surface of the substrate 100.

Here, some (e.g., 111a through 111d) of the gate electrodes 111a through 111h included in the first gate pattern 111 described above with reference to FIG. 22 may be disposed on the first fin pattern F1. On the other hand, the other gate electrodes 111e through 111h of the first gate pattern 111 and the support parts 111I may be disposed on the field insulating layer 105. That is, the support parts 111I may not be located on the first through third fin patterns F1 through F3, but the inventive concepts are not limited thereto. In other words, the support parts 111I may be disposed to not overlap the first through third fin patterns F1 through F3, but the inventive concepts are not limited thereto.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method of fabricating a semiconductor device, the method comprising:
   sequentially forming a gate layer and a mandrel layer on a substrate;
   forming a first photoresist on the mandrel layer;
   forming a mandrel pattern that extends in a first direction by at least partially removing the mandrel layer using the first photoresist as a first mask;
   forming a spacer pattern that comprises a first mandrel spacer located on a side of a first mandrel included in the mandrel pattern and a second mandrel spacer located on the other side of the first mandrel;
   forming a sacrificial layer on the first and second mandrel spacers after removing the mandrel pattern;
   forming a second photoresist, that comprises a bridge pattern overlapping part of the first mandrel spacer and part of the second mandrel spacer and extending in a second direction intersecting the first direction, on the sacrificial layer; and forming a gate pattern by at least partially removing the gate layer using the first and second mandrel spacers and the second photoresist as a second mask.

2. The method of claim 1, wherein the second direction forms an acute angle with the first direction.

3. The method of claim 1, wherein the forming of the gate pattern comprises forming first and second gate electrodes that extend in the first direction and are separated from each other, wherein the gate pattern comprises a bridge part that connects the first and second gate electrodes.

4. The method of claim 3, wherein the bridge part comprises a first protruding part that protrudes outwards from a sidewall of the first gate electrode and a second protruding part that protrudes outwards from a sidewall of the second gate electrode.

5. The method of claim 4, wherein the first protruding part is larger than the second protruding part.

6. The method of claim 3, wherein a portion of an upper surface of the bridge part is lower than upper surfaces of the first and second gate electrodes.

7. The method of claim 1, wherein the substrate comprises a fin pattern that extends in the second direction.

8. The method of claim 1, wherein the forming of the spacer pattern further comprises forming a third mandrel spacer on a side of a second mandrel included in the mandrel pattern and a fourth mandrel spacer on the other side of the second mandrel, wherein the bridge pattern overlaps the first through third mandrel spacers and does not overlap the fourth mandrel spacer.

9. The method of claim 1, further comprising forming a field insulating layer under the gate layer to partially cover the substrate, wherein the bridge pattern overlaps the field insulating layer.

10. A method of fabricating a semiconductor device, the method comprising:

forming a gate layer on a substrate;

forming a spacer pattern on the gate layer, the spacer pattern comprising a plurality of individual spacers extending in a first direction;

forming a sacrificial layer on the spacer pattern;

forming a photoresist on at least one of the individual spacers of the spacer pattern and the sacrificial layer, the photoresist having a first width, in a second direction intersecting the first direction, that is greater than a second width in the second direction of the at least one of the individual spacers;

forming a gate pattern by at least partially removing the gate layer using the spacer pattern and the photoresist as a mask.

11. The method of claim 10, wherein the gate pattern comprises a first protruding portion protruding in the second direction from a first sidewall of the gate pattern and a second protruding portion that protrudes in the second direction from a second sidewall, opposite the first sidewall, of the gate pattern.

12. The method of claim 11, wherein the at least one of the individual spacers comprises two or more individual spacers, and wherein the gate pattern further comprises a first gate electrode and a second gate electrode that are connected by a bridge pattern.

13. The method of claim 11, where the first protruding portion of the gate pattern protrudes from the first sidewall of the gate pattern at an acute angle.

14. The method of claim 11, wherein the substrate comprises a fin pattern that extends in the second direction, wherein a first individual spacer of the spacer pattern is formed on the fin pattern, wherein a second individual spacer of the spacer pattern is not formed on the fin pattern, and wherein the at least one of the individual spacers of the spacer pattern upon which the photoresist is formed comprises the second individual spacer.

\* \* \* \* \*